(12) United States Patent
Ravi

(10) Patent No.: US 8,028,260 B1
(45) Date of Patent: Sep. 27, 2011

(54) DETERMINATION OF MOST CRITICAL TIMING PATHS IN DIGITAL CIRCUITS

(75) Inventor: Ajay K. Ravi, San Jose, CA (US)

(73) Assignee: Altera Corporation, San Jose, CA (US)

( * ) Notice: Subject to any disclaimer, the term of this patent is extended or adjusted under 35 U.S.C. 154(b) by 310 days.

(21) Appl. No.: 12/251,002

(22) Filed: Oct. 14, 2008

(51) Int. Cl.
*G06F 17/50* (2006.01)

(52) U.S. Cl. .................... 716/113; 716/100
(58) Field of Classification Search ........... 716/1, 12, 716/100, 113
See application file for complete search history.

(56) References Cited

U.S. PATENT DOCUMENTS

| | | | | |
|---|---|---|---|---|
| 7,895,029 | B2 * | 2/2011 | King et al. | 703/15 |
| 2004/0002844 | A1 * | 1/2004 | Jess et al. | 703/14 |
| 2004/0216064 | A1 * | 10/2004 | Gass | 716/7 |
| 2005/0066297 | A1 * | 3/2005 | Kalafala et al. | 716/6 |
| 2006/0136859 | A1 * | 6/2006 | Bourgin | 716/18 |
| 2007/0143722 | A1 * | 6/2007 | Venkateswaran et al. | 716/6 |
| 2008/0216038 | A1 * | 9/2008 | Bose | 716/8 |
| 2009/0112557 | A1 * | 4/2009 | King et al. | 703/15 |
| 2009/0222780 | A1 * | 9/2009 | Smith | 716/6 |
| 2009/0319977 | A1 * | 12/2009 | Saxena et al. | 716/13 |

* cited by examiner

*Primary Examiner* — Jack Chiang
*Assistant Examiner* — Suchin Parihar
(74) *Attorney, Agent, or Firm* — Martine Penilla & Gencarella, LLP

(57) ABSTRACT

Methods and computer programs for determining the top most critical timing paths in an integrated circuit (IC) based on a timing graph of registers and combinational nodes in the IC are provided. One method generates the most critical path to each destination register and invokes a function to calculate the next critical path in each destination register a number of times according to the number of top most critical paths desired. The method uses recursion to calculate critical paths on the different nodes by recursively calling a function to calculate the next critical path on a fan-in node, where the fan-in node corresponds to the node which last contributed a critical path. Further, the most critical path to the node is selected in the recursive function. The critical paths are used to determine if the IC is stable under the analyzed clock frequency.

20 Claims, 4 Drawing Sheets

DETERMINATION OF MOST CRITICAL TIMING PATHS IN DIGITAL CIRCUITS

BACKGROUND

The present invention relates to calculating critical paths in signal propagation within an integrated circuit (IC). When analyzing a particular IC design, computer tools estimate signal propagation delays throughout the IC in order to determine the maximum operating frequency of the IC. Electric signals reach destination registers through intermediate registers, gates, buffers, etc. Signals may propagate to destination registers through different paths, thus causing the different signals to reach a destination register at different times depending on the signal delay thorough each of the paths.

Timing analysis tools often use timing graphs to analyze signal propagation, such as the propagation delays from source registers to destination registers. A source register is a register that has at least one timing path from itself to another register. A destination register is a register that has at least one timing path arriving from another register. A register can be both a source register and a destination register.

The design engineer is interested in finding out what are the most critical paths in the IC to determine if the application and operating frequency are appropriate for the design. Given the large amounts of registers, gates, buffers, wires, etc., in today's ICs, the calculation of all possible paths requires vast amounts of time and computer resources. It is in this context that embodiments of the invention arise.

SUMMARY

Embodiments of the present invention provide methods and computer programs for determining the top most critical timing paths in an IC based on a timing graph of registers and nodes. It should be appreciated that the present invention can be implemented in numerous ways, such as a process, an apparatus, a system, a device or a method on a computer readable medium. Several inventive embodiments of the present invention are described below.

In one embodiment, a method generates the most critical path to destination registers and invokes a function to calculate the next critical path in each destination registers a number of times according to the number of top most critical paths desired. The method uses recursion to calculate critical paths on the different nodes by recursively calling a function to calculate the next critical path on a fan-in node, where the fan-in node corresponds to the node which last contributed a critical path. Further, the most critical path to the node is selected in the recursive function. The critical paths are used to calculate the maximum operating frequency of the IC. In another embodiment, a computer program embedded in a computer-readable storage medium, when executed by one or more processors performs the method.

In another embodiment, a method for determining a number of most critical rising timing paths in an integrated circuit (IC) based on a timing graph of registers and nodes in the IC computes the rising and falling arrival paths for all destination registers. The method calculates the number of critical rising and falling path slacks on each of the destination registers, and then selects the top most critical rising path slacks from all the slacks in the destination registers.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

Embodiments of the present invention provide methods and computer programs for determining the top of most critical timing paths in an IC based on a timing graph, where the graph nodes represent registers and the input and output pins of combinational gates, and the graph edges represent the timing arcs. The method generates the most critical path to each destination register and invokes a function to calculate the next critical path in each destination registers a number of times according to the number of top most critical paths desired. The method uses recursion to calculate critical paths on the different nodes by recursively calling a function to calculate the next critical path on a fan-in node, where the fan-in node corresponds to the node which last contributed a critical path. Further, the most critical path to the node is selected in the recursive function.

The method described does not require the calculation of all the paths in the IC before determining the most critical paths. In fact, if a certain number of most critical paths is desired for each destination register, only up to that number of most critical paths need to be computed in each of the nodes of the timing graph.

It will be obvious, however, to one skilled in the art, that the present invention may be practiced without some or all of these specific details. In other instances, well known process operations have not been described in detail in order not to unnecessarily obscure the present invention.

Description of embodiments of the invention begins with the analysis for setup timing, unless otherwise specified. The adaptation of these embodiments for hold analysis is covered following the setup analysis. Before describing the methods of the present invention, a few definitions and data structures are introduced to facilitate the description of embodiments of the present invention.

Figure 1:
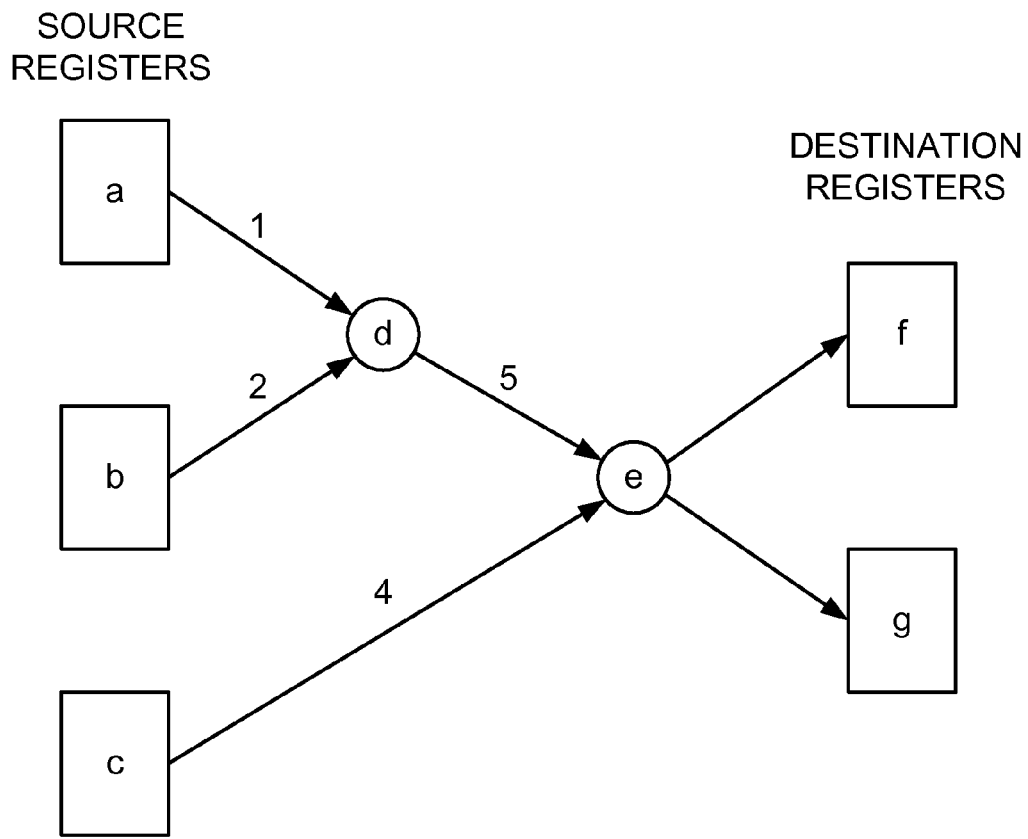
FIG. 1 depicts a timing graph including paths between source and destination registers according to one embodiment.

FIG. 1 depicts a timing graph including paths between source and destination registers according to one embodiment. A timing graph is a directed acyclic graph with nodes and edges, as seen in FIG. 1. The timing graph includes source registers (a, b, c), destination registers (f, g) and intermediate nodes or vertices (d, e). Signals travel from source registers to destination registers through one or more paths. When a register or a node is connected to another one, an arrow or edge connecting the propagation path is reflected in the timing graph. Every edge includes delays reflecting the propagation delay between source and destination of the edge. The delays in the graph include all delays associated with the transmission, such as wire delays and gate delays. In general, there can be up to four delays in one edge, depending on the signal propagating through the edge, rising/rising, rising/falling, falling/rising, and falling/falling.

A partial path ending on a node, also referred to as an arrival path, describes a timing path starting on one of the source registers and ending on the node. A rising partial path is a partial path where the signal arriving at the node has a rising transition. Similarly, a falling partial path is a partial path where the signal arriving at the node has a falling transition. Arrival path pa of node p is contained in arrival path qa of node q, if qa contains pa as a prefix, or in other words, qa contains pa. For example, in FIG. 1, path a-d-e is contained in path a-d-e-f.

Embodiments of the present invention calculate a number of the most critical paths for signal propagation to a given destination. This number of the most critical paths is referred to herein as K. K can be set at different values, such as 5, 10, 20, 100, etc., depending on user requirements and time available for computation. Embodiments of the present invention will find the most critical paths for any value chosen for K. Additionally, E is referred to as the number of edges in the timing graph, and V is the number of vertices or nodes in the timing graph.

Given a node m, an arrival path from a fan-in node to m is selected if the fan-in node is contained in one of the top K arrival paths of m. An arrival path of a fan-in node is considered discarded if the fan-in node is not contained in any of the top K arrival paths of m. An arrival time on a node for a given partial path is the time required for the signal to arrive on the node following the path. The arrival time can be a rising arrival time when the arrival time corresponds to a rising partial path, or a falling arrival time when the arrival time corresponds to a falling partial path.

A node is associated with two arrival arrays: a rising arrival array, and a falling arrival array. Arrival arrays, together with other data structures, are described in more detail below. The rising arrival array of a node is complementary to the falling arrival array, and vice-versa. Complementary, in this context, means that the signals end in a different transition, falling or rising. A timing graph has the following properties for a given clock domain:

All paths in the domain originate from a set of source registers and end in a set of destination registers.

A node has multiple arrival times, one for each of the partial paths ending on the node.

A set of arrival paths on a node are unique if they correspond to a set of unique partial paths ending on the node. A partial path p to a node n is unique if there is no other partial path ending on n that has the same ordered path components as p. In the context of timing graphs, a node is a path component. At the circuit level, a node can be a combinatorial gate's input or output pins.

Two arrival paths are duplicates of each other if they are not unique with respect to each other. In other words, duplicate is the opposite of unique.

A set of arrival paths are duplicates if every one of the arrival paths is a duplicate of another one.

A priority key is a value used to order elements in a priority queue, described below. Typically, if the elements of a queue are records with multiple fields, then the priority queue is one of the fields in the record.

The following data structures are used to describe different embodiments of the invention:
node list Path //Describes a partial path to a node
record ARec {// Arrival record on a node. Includes information about partial path ending on
  // the node
  time r // rise arrival time
  time f // fall arrival time
  time a // arrival time—generic term used to designate either r or f depending on
  // situation
  path partial_path // path to node, including the node itself as last element
  node fan_in //describes fan-in node contained in this arrival path
  node arrival_node // describes the node associated with this arrival record
}
ARec array[n-1:0] ARecArr // array of arrival records sorted according to most critical arrival
  // time
ARecArr[0] represents the partial path with the most critical arrival time, having maximum delay for setup analysis and minimum for hold analysis. ARecArr is sorted in non-decreasing order of arrival time for setup analysis, and non-increasing order of arrival time for hold analysis. The $i^{th}$ arrival path on a node is ARecArr[i].partial_path, or sometimes simply ARecArr[i]. The $i^{th}$ arrival time of a node is ARecArr[i].a.
ARec array [K-1:0] AURecArr // top K unique arrival records
ARec array [K-1:0] ARecArrRising // top K rising arrival paths
ARec array [K-1:0] ARecArrFalling // top K falling arrival paths
ARec array [K-1:0] AURecArrRising // top K unique rising arrival paths
ARec array [K-1:0] AURecArrFalling // top K unique falling arrival paths An arrival path in AURecArrRising can be a duplicate of an arrival path in AURecArrFalling, such as for example, if the two partial paths only differ in the transition to the last node.
Arc(from_node, to_node) {// timing arc between nodes from_node and to_node
  node from_node // fan in node
  node to_node //destination node
  time f_f // delay falling—falling
  time f_r // delay falling—rising
  time r_r // delay rising—rising
  time r_f // delay rising—falling
  time delay // generic delay for the arc, could be one of f_f, f_r, r_r or r_f
}
AArrType array[w-1:0] Aarr // arrival arrays on all fan-in nodes of a given node. Each element
  // of Aarr is an arrival array of a fan-in node (of the given node), and can be
  // ARecArrRising or ARecArrFalling
record QueueElement {// element in the queue
  priority p // priority determined by arrival time
  index indexAarr // index into Aarr
  index arrival_path_index // index into Aarr[indexAarr]
}
QueueElement queue PriorityQueue // Queue
record Node {// information kept regarding Node
  ARecArrRising ARecArrRising
  ARecArrFalling ARecArrFalling
  AURecArrRising AURecArrRising
  AURecArrFalling AURecArrFalling
  Aarr Aarr
  PriorityQueue pq
}

Lemma 1 defines that computing the top K non-unique arrival paths of a node requires computing the top K arrival paths on each of its fan-in nodes. At this point, rise and fall issues are not considered, and the implications are discussed below. The proof of lemma 1 is based on the definition that the arrival paths of a node m contain the arrival paths from m's fan-in nodes. Let f be a fan-in node of m, and let p be the $i^{th}$ arrival path of f, p=f.Arec[i].partial_path. Additionally, let q be the arrival path of m containing p, q=m.Arec[s].partial_path, where q contains p. Then, the arrival time of q is equal to the arrival time of p plus the delay from p to q, arc(f, m).delay. If p is contained in m's top K arrival paths, then all the arrival paths to f that are more critical than f.Arec[i] will also be included in m's top K arrival paths, because the delay would be at least as critical as the delay for p. Therefore, the maximum value for i is K Lemma 1 modified for rise and fall transitions states that the top K rising arrival paths of a node will contain at most the top K rising arrival paths of its fan-in nodes, and at most the top K falling arrival paths of its fan-in nodes. Similarly, the same applies for falling arrival paths.

Lemma 2 states that computing the top K unique arrival paths of a node requires computing the top K unique arrival paths on each of its fan-in nodes. For proof, consider node m and m's fan-in node f. Supposing that f has a set of r duplicate arrival paths p1, p2, ... pr, where p1 is the most critical among them. Then, the r arrival paths of m containing p1, p2, ..., pr are also duplicates. Therefore, m's set of unique arrival paths can have at most one arrival path from the set of r duplicate paths, and that one arrival path is p1. Only the most critical of the r duplicate arrival paths on f is needed when computing unique arrival paths on m.

The first algorithm to compute the top non-unique K paths is called the "brute force" method, based on its basic approach. At a high level, three operations are performed. First, computing the top K arrival times for each of the destination registers. Second, converting the top K arrival times to top K slacks on each of the destination registers. In general, slack is the margin by which a timing requirement is met or not met. Positive slack indicates the margin by which a requirement is met, and negative slack indicates the margin by which a requirement is not met. More specifically, setup slack on the registers is defined as the difference between the data required time and the data arrival time, while hold slack is defined as the difference between data arrival time and data required time. Third, selecting the top K slacks from all of the slacks on the destination registers. The direct application of the lemmas to compute arrival paths, without using priority queues, gives an algorithm of order O(K*E) for both unique and non-unique paths. This approach requires a lot of unnecessary computations. For example, many arrival paths computed on nodes are never 'used' in computing arrival paths on their transitive fan-out nodes. A Boolean function is a unate Boolean function if it can be written as a disjunctive boolean expression in which every term has no literal complemented. Additionally, a positive unate timing arc is a timing arc where a 0 to 1 transition at the input can only cause a 0 to 1 transition at the output, and a 1 to 0 transition on the input can only cause a 1 to 0 transition on the output. Conversely, a negative unate timing arc is a timing arc where a 0 to 1 transition at the input can only cause a 1 to 0 transition at the output, and a 1 to 0 transition on the input can only cause a 0 to 1 transition on the output. A non-unate timing arc is a timing arc where any transition at the input (i.e. 0 to 1 or 1 to 0) can cause any transition at the output (i.e. 0 to 1 or 1 to 0).

Node m has t fan-in nodes, referred to as fin(0), fin(1), ... fin(t−1). The timing arcs from fan-in nodes to m, arc(fin(i),m) have delays of arc(fin(i),m).f_f, arc(fin(i),m).f_r, arc(fin(i),m).r_r, and arc(fin(i),m).r_f. Further, let j be an index into the arrival array of fan-in node fin(i), where j<K. Each arrival path of fin(i) is contained in a rising arrival path on node m. First, if arc(fin(i),m) is positive unate or non-unate then the delay of the corresponding rising arrival path on m is:
m.ARecArrRising(s).r=fin(i).ARecArrRising(j).delay+arc(fin(i),m).r_r Second, if arc(fin(i),m) is negative unate or non-unate then the delay of the corresponding rising arrival path on m is:
m.ARecArrRising(s).r=fin(i).ARecArrFalling(j).delay+arc(fan(i),m).f_r The rising arrival path on node m containing fin(i).ARecArrRising(j) is more critical than the one containing fin(i).ARecArrRising(j+1), according to the definition of ARecArrRising.

For every node m, visited in topological order starting with source registers and ending with destination registers, perform the routine compute_rising_arrival_paths, described by the pseudo code below.
compute_rising_arrival_paths(node m) {
Let Aarr[w-1:0] be the array of arrival arrays belonging to m's fan-in nodes, whose arrival paths are contained in m's rising arrival paths.
// Aarr[i] could be either rising arrival array, or a falling arrival array. Aarr[i][j] is the $j^{th}$ arrival
// path in Aarr[i]. Aarr is an array of arrays, and that is why double indexing is used.
// Since t is the number of fan-in nodes, there can be up to 2t arrival arrays in Aarr[ ],
// that is, w≦2t. If all fan-in arcs are non-unate then w=2t
Let arc(fin(i),m).r_r or arc(fin(i),m).f_r (depending on the unateness of the fan-in arc to m) be the additional arc delay that needs to be added to the arrival times on arrival paths in Aarr[i], in order to obtain the arrival times of corresponding rising arrival paths of m.
Compute arc(fin(i),m).a // arrival delay, that can be either arc(fin(i),m).r_r or arc(fin(i),m).f_r
// This is done once per fan-in node of m, and can be pre-computed outside of this
// function, in a separate traversal.
Let candidate[w-1:0] be w counters initialized to 0 // Each counter indicates which of the
// members of Aarr is being considered. If candidate[i] is equal to j, then it indicates
// that top j-1 arrival paths in Aarr[i] have been selected to be contained in the top K
// rising arrival paths of m
int pix=0 // pix is used to count to K
While pix<K{
    Let cset={Aarr[0][candidate[0]], Aarr[1][candidate[1]], ..., Aarr[w-1][candidate[w-1]] }
    // cset is the set of current candidates, and the worst from all the candidates is
    // chosen. Each candidate corresponds to one element in Aarr[i]
    Select i such that (arc(fin(i),m).delay+Aarr[i][candidate[i]].a) is maximum in cset
    Store partial path containing (Aarr[i][candidate[i]].partial_path+m) in
        m.ARecArrRising[pix].partial_path // partial path is stored in constant time, as
        // described later
    ++candidate[i]// after selecting the corresponding candidate, then move pointer to evaluate
        // next element in array Aarr[i]
    ++pix;
}

A similar procedure is used to compute the falling arrival paths using the routine compute_falling_arrival_paths. To compute the top non-unique K paths the following operations are performed:

Perform compute_rising_arrival_paths for all Nd destination registers.

Perform compute_falling_arrival_paths for all Nd destination registers.

Compute K critical rising path slacks on each of the Nd destination registers.

Compute K critical falling path slacks on each of the Nd destination registers.

Select the top K critical rising paths corresponding to the top K critical slacks from the 2*K*Nd slacks computed on the destination registers.

Once the critical paths are determined, the corresponding slacks determine whether the IC will operate under the desired operating frequency. Negative slacks on the destination registers will indicate that the IC is not stable at the clock frequency used for the analysis. Otherwise, if all the slacks are positive, the IC will be stable at the analyzed clock frequency. The complexity of the "brute force" approach is of order O(K*E), because for each node i, the method loops K times, each time selecting the maximum of Nf(i) elements, where Nf(i) is the number of i's fan-in edges.

The second algorithm uses priority queues to compute the top K critical paths in order to improve performance. The second algorithm uses a priority queue at each node to compute the arrival paths, reducing the complexity to the order of O(E+K*V), as described by the following pseudo code.

int pix=0
int i=0
PriorityQueue m.pq // Create empty priority queue pq on node m
QueueElement element=nil // create variable to store one element of the queue
Let candidate[w-1:0] be w counters initialized to 0
    //indexAarr is the index into Aarr[ ] that identifies the arrival array, and therefore its
    // parent node
for all z from 0 to w-1//Populate m.pq with w records
    add_element_to_queue(m.pq, Aarr[z][candidate[z]].a+arc(fin(z),m).a, z)
    //m.pq is the queue. Aarr[z][candidate[z]].a+arc(fin(z),m).a is the priority or arrival
    // time. z is index into Aarr. Elements are returned in sorted order as the
    // elements are popped from the queue. The w records now in m.pq are the top
    // arrival paths from the respective arrival arrays
While pix<K{
    element=pop_first_element(m.pq)// take out the most critical path
    with m.ARecArrRising[pix] {
    i=element.indexAarr // i is index into Aarr
    a=element.p // arrival time corresponds to priority of the element popped
    partial_path=Aarr[i][candidate[i]].partial_path+m;
    fan_in=Aarr[i][candidate[i]].arrival_node //path comes from node in arrival
        // record
    arrival_node=m
    }
    ++candidate[i]
    add_element_to_queue(m.pq, Aarr[i][candidate[i]].a+arc(f,m).a , i)
    //Add next candidate to the queue from the array corresponding to the fan in
    // node that the element taken came from
    ++pix
}

The rest of the operations are same as with the "brute force" method. The complexity of the second algorithm is in the order of O(E)+O(K*V). This can be proven by assuming that (V,E) is the graph, and that the fan-in count of node i is Nf(i). Thus, for node i there is a priority queue with depth Nf(i). Initially, Nf(i) elements are pushed in the queue (to populate the empty queue), and then the method pushes and pops K times. Each push or pop takes a time in the order of log(Nf(i)). Therefore, the total time for node i is the sum of Nf(i)*log(Nf(i)) and K*log(Nf(i)). Assuming that log(Nf(i)) is small, the result is in the order of O(sum of (Nf(i)+K)), or O(E)+O(K*V).

A third algorithm to compute the top K paths calculates only the necessary paths, referred to herein as "necessary paths." The third algorithm is an incremental approach to computing K paths that minimizes unnecessary computation. An arrival path on a node is computed only when required by its fan-out node. This leads to an arrival path computation on a node only when there's a possibility of the arrival path affecting the top K paths for the clock domain. For unique paths, the duplicate arrival paths are tracked on every node by identifying duplicates at the same time as the arrival path is computed. This is done by making use of duplicate arrival paths info on the fan-in nodes. Overall this is done in O(E) time. The K paths are stored (for traversal later on) on a separate tree of nodes, such that the K paths traversal is reduced to a tree traversal. The tree is updated incrementally on every node at the same time as the arrival path is computed. Overall this is done in O(E) time.

Since the third algorithm is based on the arrival times on a node, the computation is valid for a single clock domain. Further, timing exceptions such as multicycle paths may require further division into subdomains. The third algorithm requires two graph traversals, one for setup slacks (maximum arrivals on nodes) and one for hold slacks (minimum arrivals on nodes). It should be noted that the time complexity is based on the reasonable assumption that the log of fan-in count of a node is constant. This assumption applies to every node except for the pseudo node (described below), which has all the destination registers as fan-in nodes.

The third algorithm is similar to the second algorithm, except that incremental pushes and pops on node priority queues are performed only when necessary in the third algorithm. The basic idea behind Algorithm three is that when computing rising arrival paths on node m, all the values in Aarr are not pre-computed. Instead, the method calculates only the most critical value that has not been taken from each element in Aarr. The method only calculates an arrival record inside Aarr[i], when the arrival record corresponds to a candidate. In the case where a queue is being used, as in Algorithm 2, an element is computed only when the element is needed to be put in the queue. For example, if the element corresponding to Aarr[i][j] has been selected, then Aarr[i][j+1] will have to be evaluated.

When a value is needed to be placed in Aarr[i][j+1], then the corresponding function compute_rising_arrival_paths (Aarr[i][j+1].arrival_node) or compute_falling_arrival_paths(Aarr[i][j+1].arrival_node) is evaluated. The modified function no longer computes K arrival paths, but instead computes just one arrival path. This way, an arrival path on a node is computed only when there is a possibility of the path being contained in the top K paths for the clock domain.

The high level algorithm is described as follows:
```
main( ){
    initialize( )// generate the critical arrival path to each destination register
    create pseudo node // the pseudo node is fed by all destination registers with zero
    // delay positive unate timing edges
    compute_next_arrival_path_on_pseudo_node( )// on the pseudo node.
    // compute_next_path_on_pseudo_node calls compute_next_arrival_path(m) on
    // regular nodes, which in turns calls itself recursively
}
```
This amounts to backward traversal. A new component has been added to QueueElement, arrival_path_index, which points to a record in the array defined by Aarr[indexAarr].
```
Function initialize( ) {
    For each node m visited in topological order, do {
    Create priority queue m.pq at the node and populate the queue with the top arrival paths of its fan-in arrival arrays, one element per element of m.Aarr[i]
    Let candidate[w-1:0] be w counters initialized to 0
    For z=0 to w-1 {// similar to Algorithm 2, except that arrival record includes new
        // element arrival_path_index
        add_element_to_queue (m.pq, Aarr[z][candidate[z]].a+
            arc(Aarr[z][candidate[z]].arrival_node, m).delay, z,
            candidate[z])
    }
    For each node m visited in topological order
    Compute m.ARecArrRising[0]// as shown in Algorithm 2
        by doing a single
        // pop from priority queue m.pq. At this point ARecArrRising has
        // just one element
    For each node m visited in topological order, create variable
        m.max_rising_arrival_path_index=0// indicates how many records have been
        // computed in ARecArrRising. Set to 0 because one path has just been
        // computed (the path computed has index 0)
}
```
The time complexity of initialize( ) is a function of the sum of (Nf(i)*log(Nf(i)) for all nodes i. Assuming log of fan-in node is constant, the time complexity is O(E).
```
Function compute_next_arrival_path(node m, bool is_rising)
{
    // This function applies when m is not a pseudo node
    (i, j)=arrival array index and arrival path index from ARecArrRising[max_rising_arrival_path_index]
    // ARecArrRising[max_rising_arrival_path_index] is the last arrival path previously
    // computed
    If (Aarr[i].max_rising_arrival_path_index==j)
        compute_next_arrival_path(parent_node_of  (Aarr[i]),
            Aarr[i].is_rising)
    // recursive call to node's fan-in node. This recursive call is not needed on
    // m's fan-in node f if the required arrival path on f has already been
    // computed as a result of being called from f's other fan-out node, leading to
    // fewer recursive calls
    push (m.pq, Aarr[i][j+1].a+arc(Aarr[i][0].arrival_node, m).delay, i, j+1)
    // i is the arrival array index, j+1 is the arrival path index
    (arr_time, t, u)=pop(m.pq)
    // t is the arrival array index
    //u is the arrival path index
    Store (partial path to m, t, u) in m.ARecArrRising[max_rising_arrival_path_index+1]
    //partial path to m containing Aarr[t][u]
    ++max_rising_arrival_path_index
}
```
To calculate the time complexity of calling this function once on a destination register, it is assumed that the average path depth is d. A single call on each compute_next_arrival_path results in up to d recursive calls. In each function call for node i, one push and one pop are performed on the priority queue, which takes a time of 2*log(Nf(i)). Therefore, the total time is O(d*log(Nf(i))). Assuming that log(Nf) is constant, then the total time is simply in the order of O(d).

The function compute_next_arrival_path_on_pseudo_node (node m, bool is_rising) is similar to compute_next_arrival_path for other nodes, except that the priority key for a given arrival path is not the arrival time but the negative of the slack on the register for that arrival path. The function is called K times. Internally this function calls compute_next_arrival_path( ) on destination registers. The time complexity of calling compute_next_arrival_path_on_pseudo_node once is O(d+log(ds)), where ds is the number of destination registers. The time Complexity of calling compute_next_arrival_path K times is O(K*d+K*log(ds)). If log(ds)>d, and ds~|V|, then the complexity is O(K*log(V)). If log(ds)<d, then the complexity is O(K*d).

To calculate the overall complexity of the third algorithm, the time to construct priority queue on the pseudo node must be considered. Additionally, it is assumed that the partial path storage and duplicate path tracking is O(E), as described below. The overall complexity is O(E)+O(K*d+K*log(ds))+O(ds*log(ds)). For log(ds)>d and ds~|V|, then the overall complexity is O(E)+O(K*log(V))+O(V*log(V)). For log(ds)<d, and ds<K, then the overall complexity is O(E)+O(K*d). For constant d, and ds<K, then the complexity is O(E)+O(K*log(ds)). Further, if log(ds) is assumed to be a constant, then the complexity is O(E)+O(K).

Calculation of the complexity of the method to calculate the branch slacks begins with estimating the complexity of sorting fan-in slacks on the nodes, which is O(E), assuming that the log of the number of fan-in nodes of a node is constant. The initial push of all ds registers into priority queue takes O(ds*log(ds)). Popping each node results in potentially d node traversals (to find worst case path) and d pushes into the priority queue. Therefore, the priority queue contains at most ds+K*d entries. Then, the overall complexity is O(E)+O(ds*log(ds))+O(K*d*log(ds+K*d)). If ds<K then the complexity is O(E)+O(K*d*log(K*d)). If d is constant, then the complexity is O(E)+O(K*log(K)).

Next, a new method or algorithm is described to compute unique arrival paths, referred to herein as algorithm 4. Nodes are visited in topological order, and for each node, the critical arrival paths are iteratively selected from the fan-in nodes as previously described for the other algorithms, except that if the just selected arrival path is already a duplicate of a previously selected arrival path, then the method discards the just selected path.

A new lemma 2.1 takes into consideration rise and fall transitions. Computing the top K unique rising arrival paths on a node only requires computing the top K unique rising arrival paths and the top K unique falling arrival paths of the node's fan-in nodes. Similarly, a lemma for the top K unique falling arrival paths on a node applies. The proof begins with assuming that m is the node for which the computation of the top K unique rising (falling) arrival paths is taking place. It should be noted that each of the fan-in nodes can have up to two arrival arrays, one each for rise and fall transitions. Algorithm 4 does not evaluate more than K arrival paths from any of the arrival arrays on the fan-in nodes. If this weren't the case, then the method would be required to evaluate the $(K+1)^{th}$ arrival path from arrival array Aur on a fan-in node of m.

The arrival paths on fan-in nodes are evaluated in strict order, that is, arrival path i+1 is only evaluated after evaluating the top i arrival paths. This implies that K of the arrival paths in Aur were either selected or discarded. Discarding an arrival path implies that an arrival path in the complementary arrival array was selected because every arrival path in an arrival array can only have a duplicate in its complementary arrival array (because the fan-in nodes already store unique rising and falling arrival paths since they were already visited before). Therefore, every discarded arrival path in Aur corresponds to a previously selected arrival path, and the K evaluated paths in Aur correspond to K selected paths. Hence, there is no need to evaluate the $(K+1)^{th}$ arrival path in Aur.

In order to keep track of duplicate arrival paths on each node m, the following local data structures are kept:
record path_pair {
    path_id id1
    path_id id2
}
path_pair array dupPairs[ ]// contains pairs of duplicate arrival paths by their IDs.
    // first path id is rising arrival record id
    // second path id is falling arrival record id.
path_pair array selFinRising[ ]// Keeps track of arrival paths from fan-in arrays that are
    // selected to be in m's rising arrival array
    // first path id is arrival ID from a fan-in array
    // second path id is arrival ID of m's rising arrival array
path_pair array selFinFalling[ ]// Keeps track of arrival paths from fan-in arrays that are
    // selected to be in m's rising arrival array
    // first path id is arrival ID from a fan-in array
    // second path id is arrival ID of m's falling arrival array).
The method to track duplicate paths is as follows:
Let f be m's fan-in node
Let Aarr[i] be an arrival array of f
When arrival path ap=Aarr[i][j] is selected to be contained in $n^{th}$ rising arrival path of m, do {
    if ap is contained in a pair in f.dupPair then {
    get corresponding duplicate arrival id ap_dup
    if selFinRising contains ap_dup then
        reject ap as a duplicate
    else {
        add $n^{th}$ rising arrival path of m containing ap
        // this also involves storing partial paths as explained later
        add ap and $n^{th}$ rising arrival record id of m to selFinRising
        if ap is contained in a pair in selFinFalling {
            get apc, the corresponding arrival id of m in selFinFalling.
            store the pair of $n^{th}$ arrival record id and apc in dupPairs
}}}

The complexity of this method is O(E), since it's the sum of times at each node, and time complexity at each node is linear in terms of its's fan-in count.

A shadow tree is a multi-rooted tree of shadow nodes used to store the K paths. The roots of the shadow tree represent end points of the K paths, and the leaves represent starting points for the K paths. The tree is built from the leaves up to the roots, one node at a time. One or more shadow nodes represent a single timing graph node. Each shadow node record has three members:
    1. child[ ]—set of pointers to child nodes (the number of children can vary at run time)
    2. arc_from_child[ ]—timing arcs from the corresponding child node to this node.
    3. timing_node—pointer to the timing graph node.

The procedure add_partial_path to add a path is as follows:
procedure add_partial_path( )
// ArecArr[ ] is a rising arrival array of node m on which n−1 partial paths are already populated
// Aarr[i][j] is the partial path which is selected to be contained in $n^{th}$ partial path of ArecArr[ ],
// i.e. ArecArr[n−1]
    Maintain local map shadow_node_map {
    key=index into fan-in arrival array of arrays (i of Aarr[i][j])
    value=pointer to shadow node
    }
    let p=ArecArr[n−1]
    let q=Aarr[i][j]
    if (shadow_node_map(i) doesn't exist) then {
    create new shadow nodes
    shadow_node_map(i)=s
    s.child[0]=q.shadow_node_ptr
    s.arc_from_child[0]=timing arc q.delay(m)
    s.timing_node=m
    }
    else
    s=shadow_node_map(i)
    s.child.push_back(p.shadow_node_ptr)
    p.shadow_node_ptr=&s Notice that a shadow node is created for every fan-in arrival array of m that has at least one partial path contained in the top K paths of m's rise (or fall) arrival array. Additionally, the time to update the shadow tree on node m is of order O(Nf), with Nf being the fan-in count of m. The total complexity of updating the shadow network is O(E).

Figure 2:
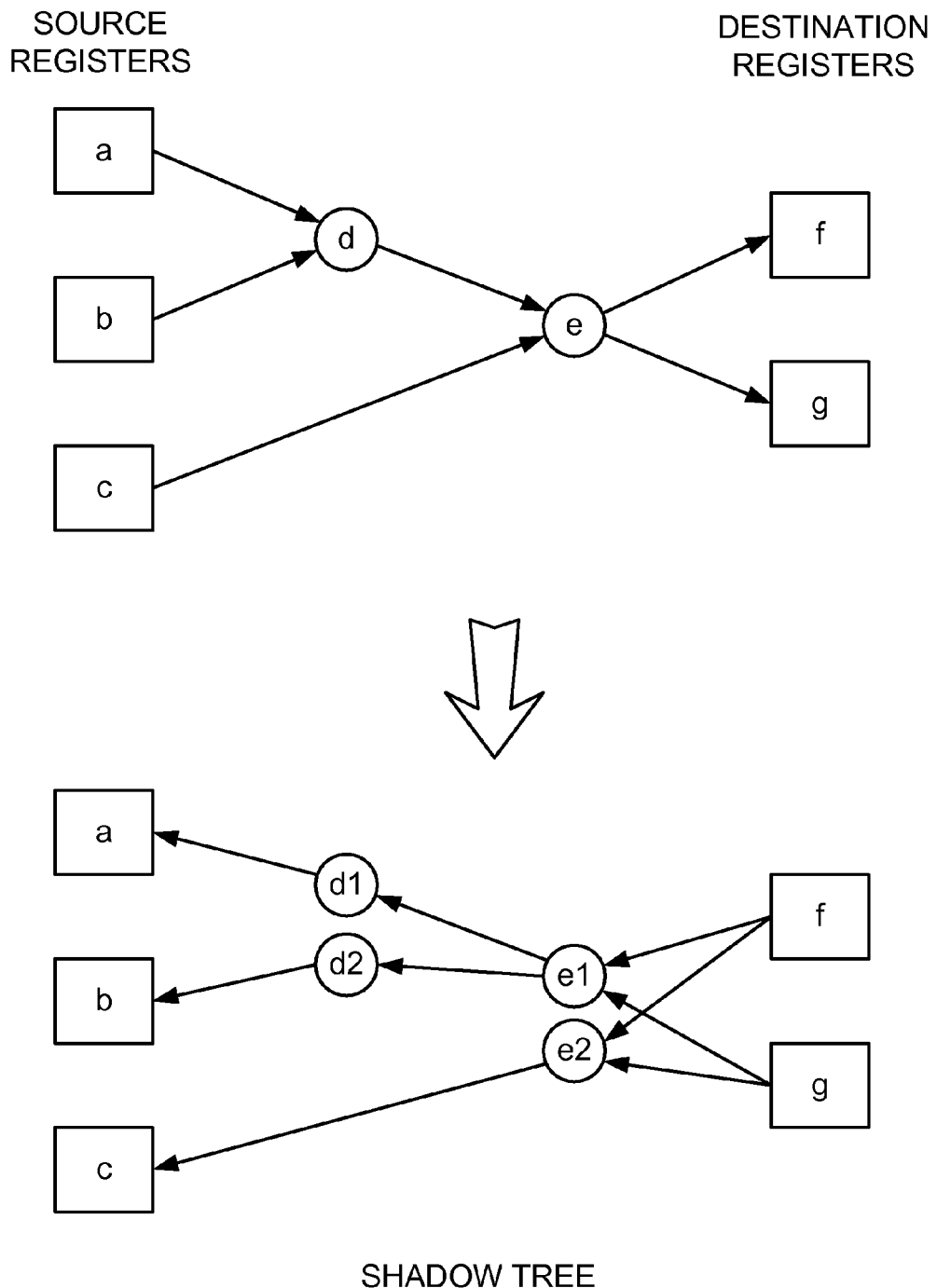
FIG. 2 depicts a timing graph and the shadow tree formed for storing K paths in accordance with one embodiment.

FIG. 2 depicts a timing graph and the shadow tree formed for storing K paths in accordance with one embodiment. Algorithm 4 previously described computes rising data arrival paths at a node for setup analysis. The overall algorithm for setup analysis also requires computing the falling data arrival paths at a node. The person skilled in the art will readily appreciate how to modify the algorithm to compute falling arrival times on a node. In addition, the hold analysis requires computing the minimum rising and falling arrival times on nodes. The described algorithm can be easily adapted for this purpose.

In summary, the overall memory usage is E+O(K*d), and the overall time complexity is O(E+K*d). The run time and the memory have a linear dependence on K and are independent of the unateness of individual components. The unique K paths version is potentially twice as slow as the non-unique version because up to 2k paths need to be computed at each node (half of them discarded due to duplicates) for each arrival array, and because there is more overhead to track duplicate arrival paths.

Figure 3:
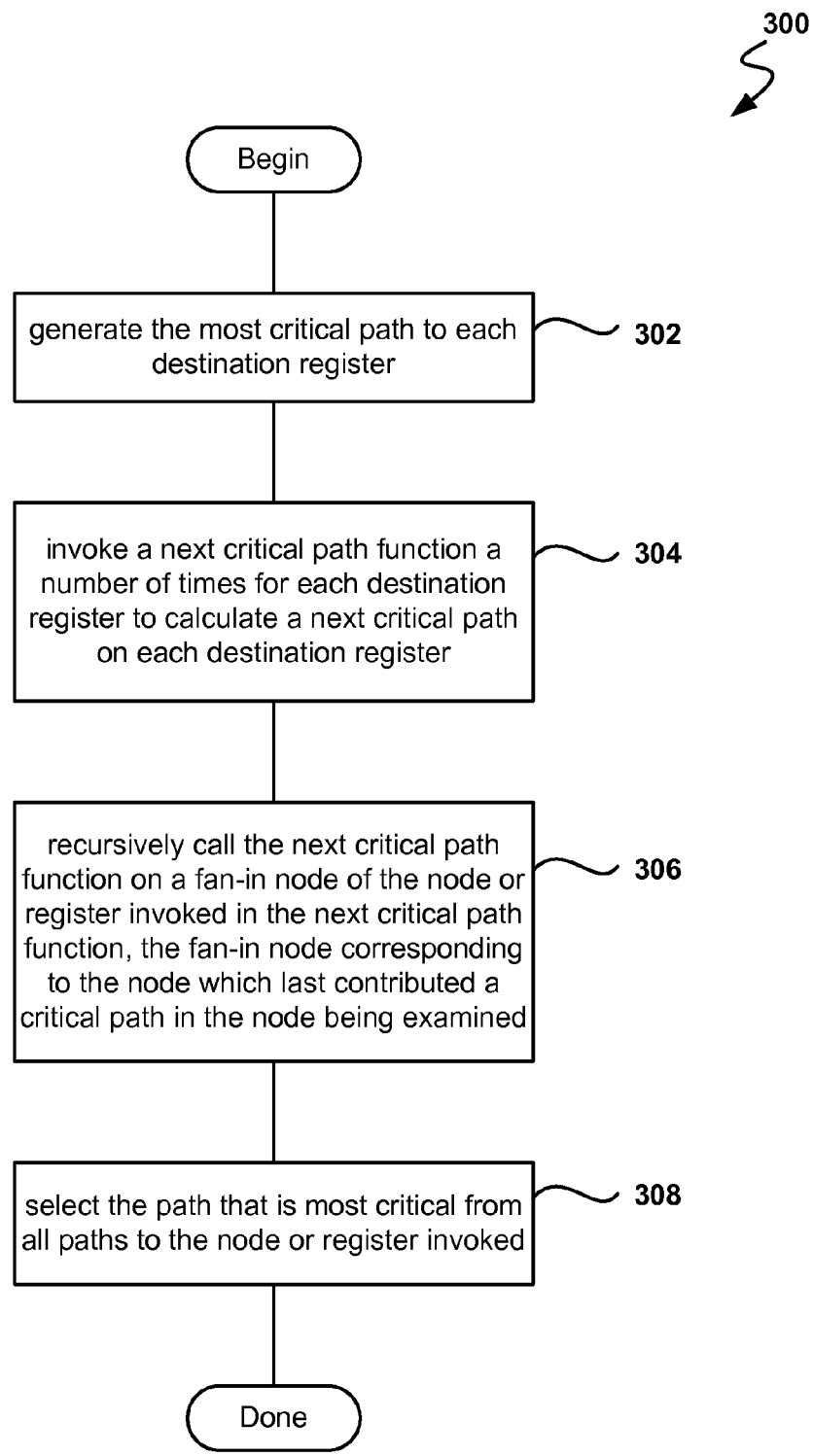
FIG. 3 shows the process flow for determining the top critical timing paths in accordance with one embodiment of the invention.

FIG. 3 shows the process flow for determining the top critical timing paths in accordance with one embodiment of the invention. In operation 302, the method generates the most critical path to each destination register. In one embodiment, the initialize routine previously described is used to perform operation 302. In operation 304, a next critical path function is invoked as many times as the number desired of most critical paths in destination registers. The next critical path function calculates the next critical path on each destination register.

In operation 306, a recursive routine is used to traverse the timing graph. A next critical path function is recursively called on a fan-in node of the node or register invoked in the next critical path function, that is, the node passed as an argument in one embodiment. The fan-in node corresponds to the node which last contributed a critical path in the node being examined. The most critical path from all paths to the node or register invoked is selected in operation 308.

Figure 4:
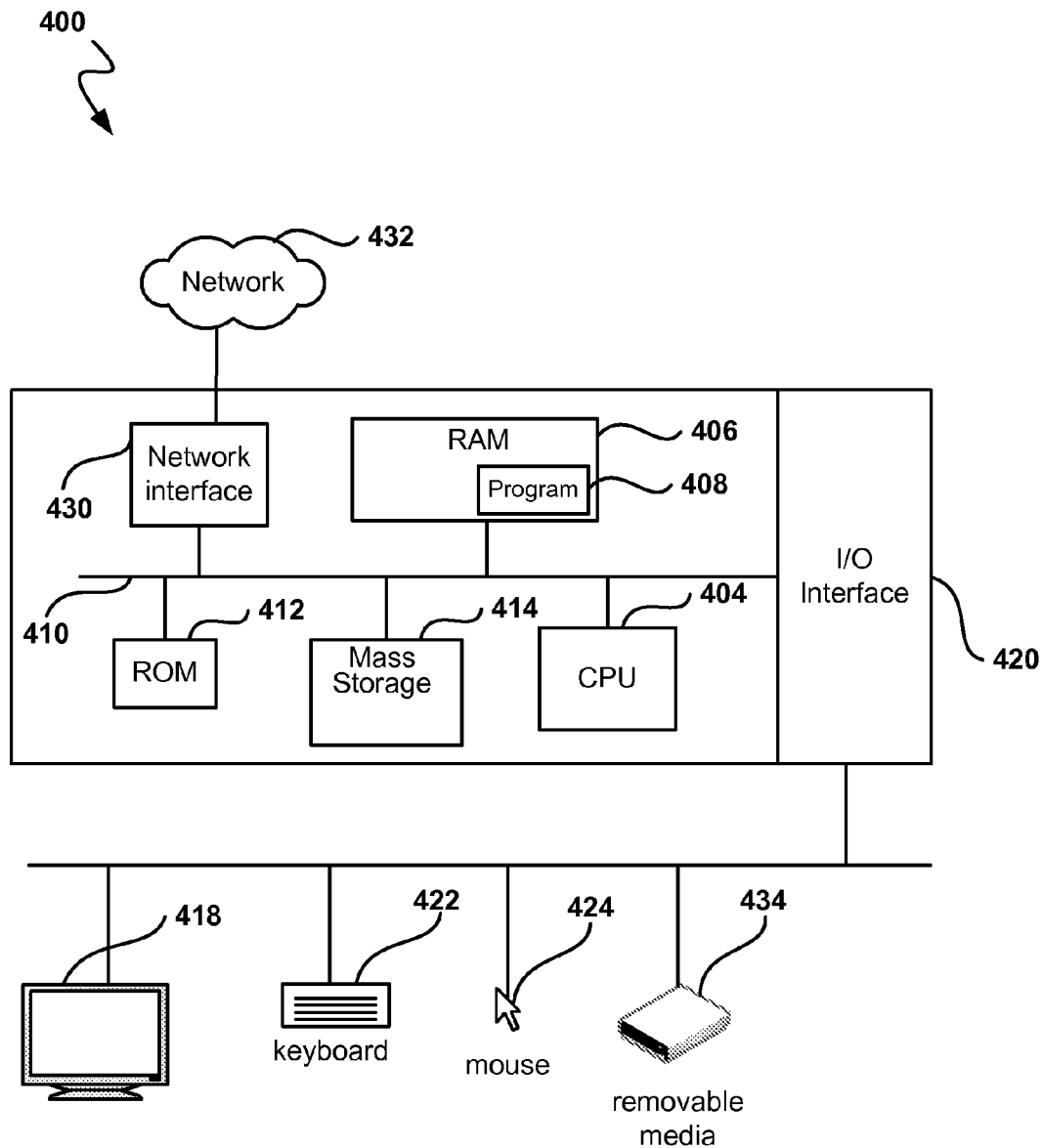
FIG. 4 is a simplified schematic diagram of a computer system for implementing embodiments of the present invention.

FIG. 4 is a simplified schematic diagram of a computer system for implementing embodiments of the present invention. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 404, which is coupled through bus 410 to random access memory (RAM) 406, read-only memory (ROM) 412, and mass storage device 414. Timing analysis program 408 resides in random access memory (RAM) 406, but can also reside in mass storage 414.

Mass storage device 414 represents a persistent data storage device such as a floppy disc drive or a fixed disc drive, which may be local or remote. Network interface 430 provides connections via network 432, allowing communications with other devices. It should be appreciated that CPU 404 may be embodied in a general-purpose processor, a special purpose processor, or a specially programmed logic device. Input/Output (I/O) interface provides communication with different peripherals and is connected with CPU 404, RAM 406, ROM 412, and mass storage device 414, through bus 410. Sample peripherals include display 418, keyboard 422, cursor control 424, removable media device 434, etc.

Display 418 is configured to display the user interfaces described herein, such as the results of the most critical paths to destination registers and the corresponding slacks. Keyboard 422, cursor control 424, removable media device 434, and other peripherals are coupled to I/O interface 420 in order to communicate information in command selections to CPU 404. It should be appreciated that data to and from external devices may be communicated through I/O interface 420. The invention can also be practiced in distributed computing environments where tasks are performed by remote processing devices that are linked through a wire-based or wireless network.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for determining critical timing paths in an integrated circuit (IC), the method comprising:
   generating a most critical path to each node of a timing graph of nodes in the IC, wherein the generating does not include generating paths other than the most critical path;
   identifying the most critical path to a node of a destination register;
   invoking a next critical path function for the destination register to calculate a next critical path to the destination register, wherein the next critical path function recursively calls the next critical path function on one fan-in node of the node invoked in the next critical path function, the one fan-in node corresponding to a fan-in node which last contributed to the most critical path;
   selecting a next most critical path to the destination register from all paths to the destination register upon completion of invoking the next critical path function for the destination register; and
   repeating the invoking and the selecting until a predetermined number of most critical paths have been selected for the destination register, wherein at least one method operation is performed by a processor.

2. The method as recited in claim 1, further including:
   creating a pseudo-node having all destination registers as children, and
   calling a next arrival path on pseudo-node function that calls the next critical path function for each destination register, the next arrival path on pseudo-node function utilizing a negative of a slack on each destination register as priority criteria for each destination register.

3. The method as recited in claim 1, wherein generating a most critical path further includes:
visiting each node in topological order, and
computing the most critical path on the visited node as the path that is most critical from all fan-in nodes to the visited node.

4. The method as recited in claim 3, wherein computing the most critical path on the visited node further includes,
pushing all arrival paths to the visited node into a priority queue, the priority in the priority queue being an arrival time associated with the arrival path, and
removing from the priority queue the most critical path.

5. The method as recited in claim 4, wherein the next critical path function includes:
determining a last critical path computed, and
invoking the next critical path function for a fan-in node corresponding to the last critical path computed.

6. The method as recited in claim 5, wherein selecting a path that is most critical further includes:
pushing into the priority queue an arrival path for the fan-in node and priority equal to an arrival time to the fan-in node plus a delay from the fan-in node to the node invoking the next critical path function,
removing from the priority queue the path that is most critical, and
determining whether the IC is stable at a given clock frequency based on the selected paths.

7. The method as recited in claim 6, wherein the pushed arrival path corresponds to a rising signal arrival path, wherein the delay is equal to a rising arrival path to the fan-in node plus a rising to rising delay from the fan-in node if an arc from the fan-in node to the visited node is one of positive unate or non-unate, wherein the delay is equal to a falling arrival path to the fan-in node plus a falling to rising delay from the fan-in node if the arc from the fan-in node to the visited node is one of negative unate or non-unate.

8. The method as recited in claim 1, wherein selecting a path that is most critical further includes:
tracking selected paths to check for paths that are duplicate, and
discarding a selected path if the selected path is a duplicate.

9. The method as recited in claim 1, wherein paths of a node are stored in a tree of nodes, the tree of nodes being a multi-rooted tree of shadow nodes, the shadow nodes representing a single timing graph node, each shadow node including:
a set of pointers to child nodes,
a timing arc from child node to shadow node, and
a pointer to the timing graph node.

10. A non-transitory computer-readable storage medium having program instructions that when executed by a computer implements a method for determining critical timing paths in an integrated circuit (IC), the method comprising:
generating a most critical path to each node of a timing graph of nodes in the IC, wherein the generating does not include generating paths other than the most critical path;
identifying the most critical path to a node of a destination register;
invoking a next critical path function for the destination register to calculate a next critical path to the destination register, wherein the next critical path function recursively calls the next critical path function on one fan-in node of the node invoked in the next critical path function, the one fan-in node corresponding to a fan-in node which last contributed to the most critical path;
selecting a next most critical path to the destination register from all paths to the destination register upon completion of invoking the next critical path function for the destination register;
repeating the invoking and the selecting until a predetermined number of most critical paths have been selected for the destination register; and
determining whether the IC is stable at a given clock frequency based on the selected most critical paths.

11. The non-transitory computer-readable storage medium of claim 10, further including:
an arrival record data structure defined to hold timing data associated with a node in the timing graph, the arrival record data structure including:
a rise arrival time,
a fall arrival time,
a path to a node,
a fan-in node, and
an arrival node, and
an array of arrival records data structure ARecArr.

12. The non-transitory computer-readable storage medium of claim 11, further including an ARecArr array data structure Aarr that represents arrival arrays to a node for all the node's fan-in nodes.

13. The non-transitory computer-readable storage medium of claim 11, further including a priority queue data structure for holding timing data associated with a node in the timing graph, wherein each element in the priority queue includes:
a priority for the element in the queue associated with an arrival time in the element,
an index into Aarr,
an arrival path index, and
a pointer to a next element in the priority queue.

14. The non-transitory computer-readable storage medium of claim 13, further including a nodal data structure holding timing information for the nodes in the timing graph, the nodal data structure including:
an array of rising arrival records,
an array of falling arrival records,
an Aarr data structure, and
a priority queue.

15. The non-transitory computer-readable storage medium of claim 14, further including an arc data structure that includes timing information for connections between nodes of the timing graph, the arc data structure including:
an origin node,
a destination node,
a falling to falling delay,
a falling to rising delay,
a rising to rising delay, and
a rising to falling delay.

16. A method for determining critical rising timing paths in an integrated circuit (IC), the method comprising:
computing a number K of most critical rising arrival paths for all destination registers in the IC based on a timing graph of nodes, wherein the computing does not include computing rising arrival paths other than the K most critical rising arrival paths, wherein computing the K most critical rising arrival paths for all destination registers includes creating a pseudo-node having all destination registers as children and invoking a recursive function at the pseudo-node to calculate each critical rising arrival path;
computing K most critical falling arrival paths for all destination registers in the IC based on the timing graph of nodes, wherein paths other than the K most critical falling arrival paths are not computed;
calculating K critical rising path slacks on each of the destination registers;
calculating K critical falling path slacks on each of the destination registers; and
selecting K most critical rising timing paths corresponding to most critical slacks from all the calculated critical rising path slacks on the destination registers, wherein at least one method operation is performed by a processor.

17. The method as recited in claim 16, wherein computing the K most critical rising arrival paths further includes,
visiting every node and register in the timing graph in topological order from source registers to destination registers, and
computing the rising arrival paths on each visited node or register.

18. The method as recited in claim 17, wherein computing the rising arrival paths on each visited node further includes,
computing arrival delays for all paths from fan-in nodes to the visited node as a sum of an arrival delay at the fan-in node plus a delay from the fan-in node to the visited node,
selecting the path from the fan-in node corresponding to a maximum arrival delay to the visited node, and
storing the selected path in the visited node.

19. The method as recited in claim 18, wherein the computed arrival delay is equal to a rising arrival path to the fan-in node plus a rising to rising delay from the fan-in node if an arc from the fan-in node to the visited node is one of positive unate or non-unate, wherein the computed arrival delay is equal to a falling arrival path to the fan-in node plus a falling to rising delay from the fan-in node if the arc from the fan-in node to the visited node is one of negative unate or non-unate.

20. The method as recited in claim 16, further including,
storing arrival paths to the visited node into a priority queue, the priority in the priority queue being an arrival time associated with the arrival path,
wherein the number K of most critical rising timing paths is equal to the number of critical rising and falling path slacks.

* * * * *